(12) United States Patent
Melanson

(10) Patent No.: US 7,358,880 B1
(45) Date of Patent: Apr. 15, 2008

(54) MAGNETIC FIELD FEEDBACK DELTA-SIGMA MODULATOR SENSOR CIRCUIT

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/685,306

(22) Filed: Mar. 13, 2007

Related U.S. Application Data

(60) Provisional application No. 60/888,622, filed on Feb. 7, 2007.

(51) Int. Cl.
*H03M 3/00* (2006.01)
(52) U.S. Cl. ...................... 341/143; 341/144
(58) Field of Classification Search ......... 341/136–170
See application file for complete search history.

(56) References Cited

U.S. PATENT DOCUMENTS

| | | | |
|---|---|---|---|
| 6,285,769 B1 * | 9/2001 | Edelson et al. | 381/95 |
| 6,420,868 B1 * | 7/2002 | Ganther et al. | 324/248 |
| 6,639,395 B2 * | 10/2003 | Male | 324/106 |
| 6,798,965 B2 * | 9/2004 | Zdinak et al. | 385/134 |
| 7,310,584 B2 * | 12/2007 | Royle | 702/65 |

OTHER PUBLICATIONS

Demierre, et al., "Improvements of CMOS Hall Microsystems and Application for Absolute Angular Position Measurements", Ecole Polytechnique Federale de Lausanne, Sep. 2003, Switzerland.
Sentron AG, Datasheet for CSA-1V, Aug. 2004, Switzerland.
Pastre, et al., "A Hall Sensor Analog Front End for Current Measurement with Continuous Gain Calibration", IEEE International Solid-State Circuits Conference 2005 Digest of Papers, IEEE Press, pp. 242-243.

* cited by examiner

*Primary Examiner*—Lam T. Mai
(74) *Attorney, Agent, or Firm*—Andrew M. Harris; Mitch Harris, Atty at Law, LLC

(57) ABSTRACT

A magnetic field feedback delta-sigma modulator sensor circuit, provides accurate magnetic field measurements without requiring complex additional calibration circuitry. The output of the semiconductor magnetic field sensor, which may be a Hall effect sensor, is coupled to the input of the delta-sigma modulator loop filter. The output of the quantizer of the delta-sigma modulator is magnetically coupled to the magnetic field sensor, producing a field that causes the output of the sensor to be canceled for frequencies in the band of the modulator loop filter. The output of the quantizer is provided to a current output digital-to-analog converter, which feeds a current loop that is inductively coupled to the sensor body. A chopper amplifier can be provided between the output of the sensor and the modulator loop filter input to reduce 1/f noise and bias current and output terminals can be rotated to further reduce 1/f noise and offset.

20 Claims, 3 Drawing Sheets

MAGNETIC FIELD FEEDBACK DELTA-SIGMA MODULATOR SENSOR CIRCUIT

CROSS-REFERENCE TO RELATED APPLICATIONS

This application is related to U.S. provisional applications Ser. No. 60/888,622 and Ser. No. 60/888,622, both filed Feb. 7, 2007 and from which it claims benefits under 35 U.S.C. §119(e).

BACKGROUND OF THE INVENTION

1. Field of the Invention

The present invention relates generally to magnetic field sensors, and more specifically, to a converter circuit for providing a digital output from a semiconductor magnetic field sensor.

2. Background of the Invention

Hall effect sensors and other semiconductor magnetic field sensors are widely used in applications in which it is desirable to provide a measurement of DC magnetic fields and relatively low frequency AC magnetic fields that are not otherwise easily sensed with coils or other antennas. Such applications include position and motion sensors for both linear and rotational motion, power supply and motor control applications in which the transformer or motor fields are detected, audio speaker applications in which the strength of the speaker's signal-induced field is detected, and lighting controllers for high-frequency energized lamps, such as sodium lamps.

Semiconductor magnetic field sensors typically vary widely in their output voltage vs. field strength sensor function, both with temperature and from device to device. Background magnetic fields may also contribute to measurement error, depending on the proximity of magnetic field sources and/or the strength of the field being measured with respect to normal background magnetic field strength.

Typical circuits for measuring the output of a semiconductor magnetic field sensor include circuits that connect a Hall effect or other sensor in the feedback path of an operational amplifier circuit, which is then provided to an analog-to-digital converter circuit or an analog comparator that detects the sensor output. Calibration in offset and gain provide for compensation for variation between devices, and temperature compensation may also be included in the amplifier circuit.

More recently, sensor implementations have been proposed that impose an AC magnetic field on the sensor, which can then be detected at the sensor output and used to calibrate the sensor circuit. One or more current loops is implemented around the sensor and stimulated with a signal having known characteristics, inducing an AC magnetic field at the sensor, which causes an AC voltage of the same frequency profile in the sensor output voltage. The sensor output can then be detected and the gain of the sensor circuit adjusted to calibrate the sensor. However, such a circuit has significant extra complexity, since a calibration source and detector are required, and the calibration must be either periodic, or out of the band of the desired detection range of the sensor circuit, which will typically require additional filtering circuitry.

Therefore, it would be desirable to provide a semiconductor magnetic field sensor measurement circuit that is calibrated via an induced magnetic field, without requiring much additional complexity in the measurement and calibration circuits.

SUMMARY OF THE INVENTION

The above stated objective of providing a semiconductor magnetic field sensor measurement circuit that is calibrated via an induced magnetic field, without requiring much additional complexity in the measurement and calibration circuits is accomplished in a circuit and method. The method is a method of operation of the circuit.

The circuit is a delta-sigma analog-to-digital converter having the semiconductor magnetic field sensor output terminal connected to an input of the delta-sigma modulator. The output of the quantizer of the delta-sigma modulator is magnetically coupled to the body of the semiconductor magnetic field sensor, providing a feedback path that causes a magnetic field to be imposed at the sensor that cancels the voltage produced at the output of the sensor, for frequencies in the band of the converter loop filter. Variations in the average value of the quantizer output thus represent variations in the detected magnetic field. The quantizer output is coupled to a current output digital-to-analog converter which provides a current that energizes a current loop that is inductively coupled to the sensor body.

The action of the magnetic field feedback described above provides automatic calibration of the measurement circuit and sensor, since the relationship between the quantizer output and the field produced by the current loop is well-defined. Therefore, variations in the external magnetic field that are canceled by the action of the feedback are also well-defined. A chopper amplifier can be coupled between the sensor voltage output and the loop filter of the converter to remove offset and prevent the introduction of 1/f noise in the measurement. Further reduction of sensor variation error and 1/f noise can be accomplished by rotating the bias and sensor output terminal positions by using a rotating switching circuit.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a semiconductor magnetic field sensor circuit and method that uses the noise-shaping loop of a delta-sigma modulator analog-to-digital converter (ADC) to provide a calibration signal to the semiconductor magnetic field sensor. The resulting operation self-calibrates the circuit to compensate for the offset voltage and low frequency variation of the sensor output signal. The ADC output provides the digital output of the sensor circuit, yielding a compact integrated solution with high degree of noise immunity.

Figure 1:
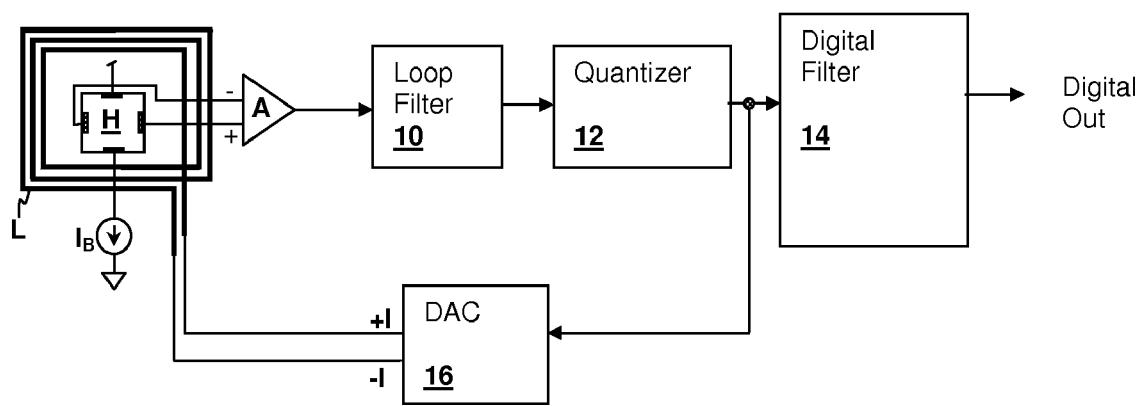
FIG. 1 is a block diagram depicting a magnetic field sensor circuit topology in accordance with an embodiment of the present invention.

Referring now to FIG. 1, a semiconductor magnetic field sensor circuit in accordance with an embodiment of the present invention is shown. A Hall effect sensor H, which may alternatively be another type of magnetic field sensor such as a magneto-resistive device, is provided a bias current $I_B$, and has output terminals connected to differential inputs of amplifier A, which may be a chopper amplifier to reduce offset and 1/f noise that would otherwise be introduced by amplifier A. A loop filter 10 filters the output of amplifier A and a quantizer 12 quantizes the output of loop filter 10 to provide an analog-to-digital conversion. The output of quantizer 12 is converted to a differential current by a digital-to-analog converter (DAC) 16. The outputs of DAC 16 are connected to a magnetic feedback current loop L, which has an axis aligned with the magnetic field sensing axis of Hall effect sensor H, e.g., the plane of the semiconductor body of Hall effect sensor H is parallel to the plane of the windings of loop L.

As quantizer 12 generates a noise-shaping waveform, a magnetic field is induced by loop L that causes a corresponding variation in the output voltage of Hall effect sensor H. Thus, the circuit of FIG. 1 provides a delta-sigma modulator loop that includes the inductive coupling of current loop L to Hall effect sensor H, as well as the sensor function from the field present at Hall effect sensor H to the output terminals of Hall effect sensor H. Since the magnetic field characteristics of current loop L are substantially linear and well-known, provided that ferromagnetic or paramagnetic materials are not within proximity of current loop L, the closed-loop converter has a well defined transfer function from changes in magnetic field strength at sensor H to changes in the output of quantizer 12. The action of the feedback provided by DAC 16 and current loop L provides that the average value of the output of quantizer reflects only the external magnetic field at Hall effect sensor H, as the magnetic field introduced by current loop L and any offset from Hall effect sensor H are canceled by the action of the delta-sigma modulator loop. The output of quantizer 12 is decimated and filtered by digital decimation filter 14 to yield a digital number corresponding to the external field strength at sensor H.

Figure 2:
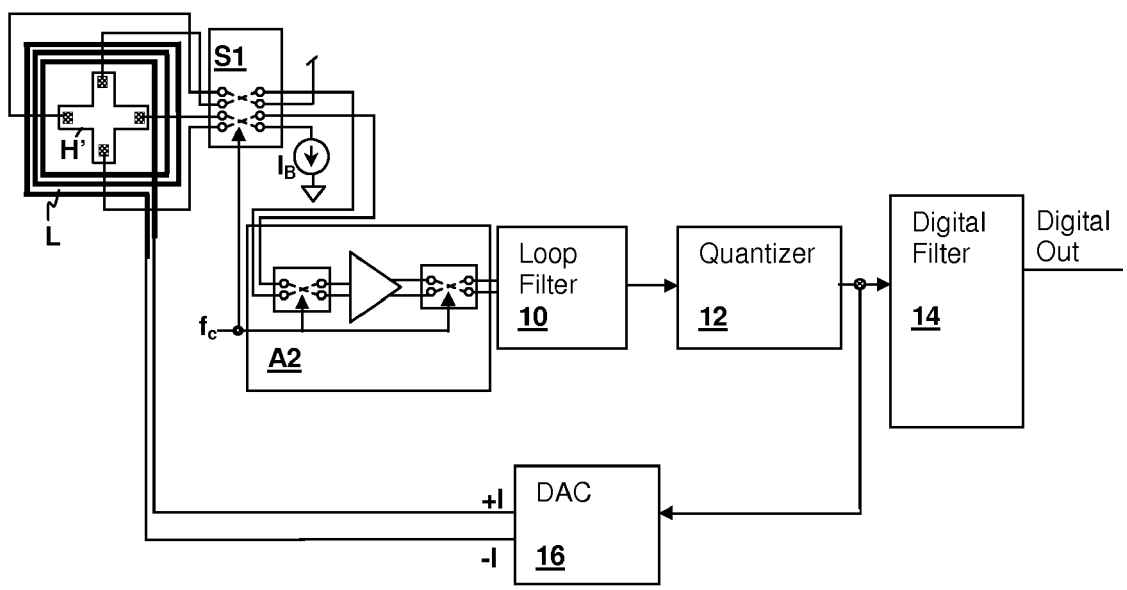
FIG. 2 is a block diagram depicting a magnetic field sensor circuit topology in accordance with another embodiment of the present invention.

Referring now to FIG. 2, a semiconductor magnetic field sensor circuit in accordance with another embodiment of the present invention is shown. A Hall effect sensor H', which may alternatively be another type of magnetic field sensor such as a magneto-resistive device, has four terminals connected to a switch S1, which is operated by a clock signal that alternates which opposing pair of Hall effect sensor H terminals receive bias current $I_B$ and which (opposing) pair of terminals provide the output voltage to the differential inputs of a chopper amplifier A2. The alternation of terminals of Hall effect sensor H is known as rotating or "spinning" the Hall effect bias current. The action provided by switch S1 further reduces 1/f noise and offset from Hall effect sensor H, as the bias current $I_B$ is effectively shifted (chopped) to the chopping frequency $f_c$ that also controls chopper amplifier A2. The operation of switch S1 and chopper amplifier A2 thus shifts the field detection frequency by the chopping frequency, so that offset and low-frequency 1/f noise and other artifacts are removed from the measurement. The remainder of the circuit of FIG. 2 operates as described above with reference to the circuit of FIG. 1.

Figure 3:
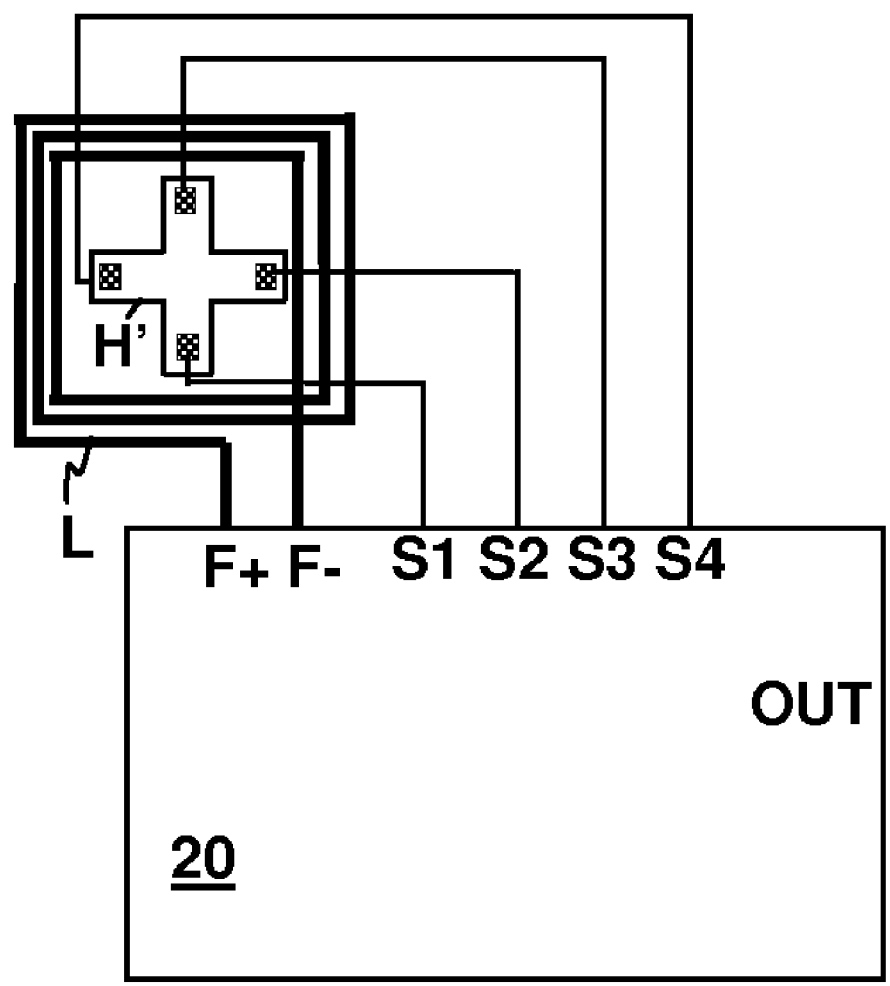
FIG. 3 is a pictorial diagram depicting an integrated circuit die in accordance with another embodiment of the present invention connected to a magnetic field sensor.

Referring now to FIG. 3, an integrated circuit die 20 in accordance with an embodiment of the present invention is shown connected to semiconductor magnetic field sensor H' and magnetic feedback loop L. The circuits shown in FIG. 1 or FIG. 2 may be integrated on integrated circuit die 20. In the depicted embodiment, die 20 has four input terminals S1-S4 corresponding to the sensor-side terminals of switch S1 of FIG. 2. Terminals F− and F+ are provided from the output of DAC 16 for providing feedback signals to feedback loop L. An output terminal OUT provides a digital output signal from digital decimation filter 14.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A circuit for providing a digital output signal from a semiconductor magnetic field sensor, comprising:
    at least one input terminal for receiving an output signal from said semiconductor magnetic field sensor;
    at least one sensor feedback terminal for providing a current to a magnetic feedback loop magnetically coupled to said semiconductor magnetic field sensor;
    a loop filter having an input coupled to said at least one input terminal for noise-shaping said output signal of said semiconductor magnetic field sensor;
    a quantizer having an input coupled to an output of said loop filter, wherein said digital output signal is generated in conformity with an output of said quantizer; and
    a digital-to-analog conversion circuit having an input coupled to said output of said quantizer and an output coupled to said at least one sensor feedback terminal, wherein said loop filter, said quantizer, said digital-to-analog conversion circuit and said semiconductor magnetic field sensor operate as a delta-sigma modulator.

2. The circuit of claim 1, wherein said semiconductor magnetic field sensor is a Hall effect sensor and wherein said loop filter has a response adapted for processing an output voltage of said Hall effect sensor.

3. The circuit of claim 1, wherein said digital-to-analog conversion circuit has a differential pair of current outputs, and wherein said at least one sensor feedback terminal is a pair of sensor feedback terminals connected to said differential pair of current outputs of said digital-to-analog conversion circuit.

4. The circuit of claim 1, wherein said semiconductor magnetic field sensor has a pair of bias current terminals, and wherein said circuit further comprises a constant current source coupled between said pair of bias current terminals.

5. The circuit of claim 1, further comprising:
    a switching circuit for coupling said at least one input terminal to a first terminal of said semiconductor magnetic field sensor in response to a first state of a switching clock signal and to a second terminal of said semiconductor magnetic field sensor in response to a second state of said switching clock signal; and
    a constant current source coupled to said switching circuit, wherein said switching circuit couples said constant current source to said second terminal of said semiconductor magnetic field sensor in response to said first state of said switching clock signal and said first terminal of said semiconductor magnetic field sensor in response to said second state of said switching clock signal.

6. The circuit of claim 5, wherein said at least one input terminal is a pair of input terminals, and wherein said switching circuit couples said first terminal and a third terminal of said semiconductor magnetic field sensor to corresponding ones of said pair of input terminals in response to said first state of said switching clock signal, and couples said second terminal and a fourth terminal of said semiconductor magnetic field sensor to corresponding ones of said pair of input terminals in response to said second state of said switching clock signal.

7. The circuit of claim 5, further comprising a chopper amplifier having a pair of inputs for providing said pair of input terminals, and an output coupled to said loop filter input.

8. The circuit of claim 7, wherein said chopper amplifier is switched by said switching clock signal.

9. A method for measuring a magnetic field, comprising:
sensing said magnetic field with a semiconductor magnetic field sensor;
noise-shaping a result of said sensing with a loop filter;
quantizing a result of said noise-shaping to produce a digital output; and
converting a result of said quantizing to a feedback magnetic field at said semiconductor magnetic field sensor.

10. The method of claim 9, wherein said semiconductor magnetic field sensor is a Hall effect sensor and wherein said filtering processes an output voltage of said Hall effect sensor.

11. The method of claim 9, wherein said converting comprises:
converting said result of said quantizing to an analog current; and
applying said analog current to a loop magnetically coupled to said semiconductor magnetic field sensor.

12. The method of claim 9, further comprising applying a constant bias current to a pair of bias current terminals of said semiconductor magnetic field sensor.

13. The method of claim 9, further comprising:
first rotating application of a constant bias current between two sets of terminals of said semiconductor magnetic field sensor; and
second rotating an input of said filtering between said two sets of terminals, such that input to said filtering is alternatively obtained from one of said two sets of terminals to which the constant bias current is not applied.

14. The method of claim 13, further comprising chopping a result of said second rotating with a chopper amplifier.

15. The method of claim 14, wherein said chopping is performed as the same rate as said first and second rotating.

16. A circuit integrated on a single die for providing a digital output signal from a semiconductor magnetic field sensor, comprising:

at least one input terminal for receiving an output signal from said semiconductor magnetic field sensor;
at least one sensor feedback terminal for providing a current to a magnetic feedback loop magnetically coupled to said semiconductor magnetic field sensor;
a loop filter having an input coupled to said at least one input terminal for noise-shaping said output signal of said semiconductor magnetic field sensor;
a quantizer having an input coupled to an output of said loop filter; and
a digital-to-analog conversion circuit having an input coupled to an output of said quantizer and an output coupled to said at least one sensor feedback terminal, whereby a magnetic coupling between said semiconductor magnetic field sensor and said magnetic feedback loop provides feedback between said quantizer and said loop filter of said delta-sigma modulator, whereby said loop filter, said quantizer, said digital-to-analog conversion circuit and said semiconductor magnetic field sensor operate as a delta-sigma modulator that provides said digital output.

17. The circuit of claim 16, wherein said magnetic feedback loop is integrated on said die.

18. The circuit of claim 16, further comprising a digital decimation filter integrated on said die and having an input coupled to said output of said quantizer.

19. A circuit, comprising:
a semiconductor magnetic field sensor;
a magnetic feedback loop magnetically coupled to said semiconductor magnetic field sensor;
a loop filter having an input coupled to said at least one input terminal for noise-shaping said output signal of said semiconductor magnetic field sensor;
a quantizer having an input coupled to an output of said loop filter; and
a digital-to-analog conversion circuit having an input coupled to an output of said quantizer and an output coupled to said magnetic feedback loop, whereby said loop filter, said quantizer, said digital-to-analog conversion circuit and said semiconductor magnetic field sensor operate as a delta-sigma modulator.

20. The circuit of claim 19, wherein said digital-to-analog conversion circuit has a differential pair of current outputs, and wherein said at least one sensor feedback terminal is a pair of sensor feedback terminals connected to said differential pair of current outputs of said digital-to-analog conversion circuit.

* * * * *